(12) United States Patent
Lee et al.

(10) Patent No.: US 12,477,814 B2
(45) Date of Patent: Nov. 18, 2025

(54) SEMICONDUCTOR DEVICE AND METHOD OF FABRICATING THE SAME

(71) Applicant: UNITED MICROELECTRONICS CORP., Hsin-Chu (TW)

(72) Inventors: Kuo-Hsing Lee, Hsinchu County (TW); Chun-Hsien Lin, Tainan (TW); Yung-Chen Chiu, Taichung (TW); Sheng-Yuan Hsueh, Tainan (TW); Chi-Horn Pai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 812 days.

(21) Appl. No.: 17/844,742

(22) Filed: Jun. 21, 2022

(65) Prior Publication Data
US 2023/0378167 A1 Nov. 23, 2023

(30) Foreign Application Priority Data
May 23, 2022 (CN) .......................... 202210562527.8

(51) Int. Cl.
*H01L 21/768* (2006.01)
*H10D 84/01* (2025.01)
*H10D 84/03* (2025.01)
*H10D 84/80* (2025.01)

(52) U.S. Cl.
CPC ....... *H10D 84/811* (2025.01); *H10D 84/0142* (2025.01); *H10D 84/0149* (2025.01); *H10D 84/0151* (2025.01); *H10D 84/0158* (2025.01); *H10D 84/038* (2025.01)

(58) Field of Classification Search
None
See application file for complete search history.

(56) References Cited

U.S. PATENT DOCUMENTS

| 9,449,964 B2 | 9/2016 | Hung |
| 9,698,215 B2 | 7/2017 | Basker |
| 2003/0077875 A1 | 4/2003 | Mandelman |
| 2014/0284671 A1* | 9/2014 | Hung ..................... H10D 1/692 257/296 |
| 2018/0090559 A1 | 3/2018 | Yang |

* cited by examiner

*Primary Examiner* — Steven B Gauthier
*Assistant Examiner* — Lamont B Koo
(74) *Attorney, Agent, or Firm* — Winston Hsu (57) ABSTRACT

The present disclosure provides, the semiconductor device includes a substrate, a first transistor, a capacitor, and two first plugs. The substrate has a high-voltage region and a capacitor region. The first transistor is disposed in the high-voltage region, and includes a first gate dielectric layer, a first gate electrode, and a first capping layer. The capacitor is disposed in the capacitor region and includes a second gate electrode, a second capping layer, a dielectric layer, and a conductive layer. The two first plugs are disposed on the capacitor, wherein one of the two first plugs penetrates through the second capping layer to directly contact the second gate electrode, and another one of the two first plugs directly contacts the conductive layer.

19 Claims, 7 Drawing Sheets

SEMICONDUCTOR DEVICE AND METHOD OF FABRICATING THE SAME

BACKGROUND OF THE INVENTION

1. Field of the Invention

The present disclosure relates generally to a semiconductor device and a method of fabricating the same, and more particularly to a semiconductor device including a high-voltage (HV) component, a low-voltage (LV) component, and a capacitor together and a method of fabricating the same.

2. Description of the Prior Art

According to the current semiconductor technology, it is able to integrate control circuits, memories, low-voltage operating circuits, and high-voltage operating circuits and components on a single chip together, thereby reducing costs and improving operating efficiency. High-voltage components such as vertical double-diffusion metal-oxide-semiconductor (VDMOS), insulated gate bipolar transistor (IGBT), lateral-diffusion metal-oxide-semiconductor (LDMOS), etc. fabricated in a chip are used in various applications due to their better power switching efficiency. Those skilled in the art should know that the aforementioned high-voltage components are often required to withstand higher breakdown voltages and operate at lower resistance values.

In addition, as the size of semiconductor components becomes smaller and smaller, there are many improvements in the process steps of forming transistors to fabricate transistors with small volume and high quality. For example, non-planar field effect transistors, such as fin field-effect transistors (FinFETs), have replaced planar field effect transistors as the current mainstream development trend. However, as the size of devices continues to decrease, it becomes more difficult to dispose high-voltage components and fin field-effect transistors on the same semiconductor device together, and the processes of fabricating the semiconductor device also faces many limitations and challenges.

SUMMARY OF THE INVENTION

An object of the present disclosure is to provide a semiconductor device, where the lower electrode layer of a capacitor is formed within a general gate process of a semiconductor transistor. Through these arrangements, the present disclose enables to achieve the formation of a metal-insulator-metal (MIM) via a simplified process flow, with the structural integrity and elemental performance of the semiconductor device being effectively maintained at the same time. Thus, the semiconductor device of the present disclosure may gain better functions and performances.

An object of the present disclosure is to provide a method for fabricating a semiconductor device, which integrates the fabrications of a high-voltage component, a low-voltage component, and a capacitor, to effectively integrate the formation of semiconductor components with plenty structural differences, and to make sure the semiconductor components formed thereby still have a good structural integrity and elemental performance.

To achieve the aforementioned objects, the present disclosure provides a semiconductor device including a substrate, a first transistor, a capacitor, and two first plugs. The substrate includes a high-voltage region and a capacitor region. The first transistor is disposed in the high-voltage region, and includes a first gate dielectric layer disposed on a surface of the substrate, a first gate electrode disposed on the first gate dielectric layer, and a first capping layer disposed on the first gate electrode. The capacitor is disposed in the capacitor region, the capacitor, and includes a second gate electrode disposed on the substrate, second capping layer disposed on the second gate electrode, a dielectric layer disposed on the second capping layer and the first capping layer, and a conductive layer disposed on the dielectric layer. The two first plugs are disposed on the capacitor, wherein one of the two first plugs penetrates through the second capping layer to directly contact the second gate electrode, and another one of the two first plugs directly contacts the conductive layer.

To achieve the aforementioned objects, the present disclosure provides a method of fabricating a semiconductor device including the following step. Firstly, a substrate is provided, and the substrate has a high-voltage region and a capacitor region. Next, a first transistor is formed in the high-voltage region, and which includes a first gate dielectric layer disposed on a surface of the substrate, a first gate electrode disposed on the first gate dielectric layer, and a first capping layer disposed on the first gate electrode. Then, a capacitor is formed in the capacitor region, and which includes a second gate electrode disposed on the substrate, a second capping layer disposed on the second gate electrode, a dielectric layer disposed on the second capping layer and the first capping layer, and a conductive layer disposed on the dielectric layer. After that, two first plugs are formed on the capacitor, wherein one of the two first plugs penetrates through the second capping layer to directly contact the second gate electrode, and another one of the two first plugs directly contacts the conductive layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 illustrates schematic diagrams of a method of fabricating a semiconductor device according to one embodiment of the present disclosure, in which:

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

The present disclosure relates to a method of fabricating a semiconductor device, which integrates the fabrication methods of a high-voltage (HV) component, a low-voltage (LV) component, and capacitor. The high-voltage component may refer to semiconductor transistors with an initial voltage between 10 volts and 20 volts, and the low-voltage component may refer to semiconductor transistors with an initial voltage between 0.5 volt and 1 volt, but not limited thereto. Please refer to FIG. 1 to FIG. 7, which are schematic diagrams of a method of fabricating a semiconductor device 100 according to one embodiment of the present disclosure.

Figure 1:
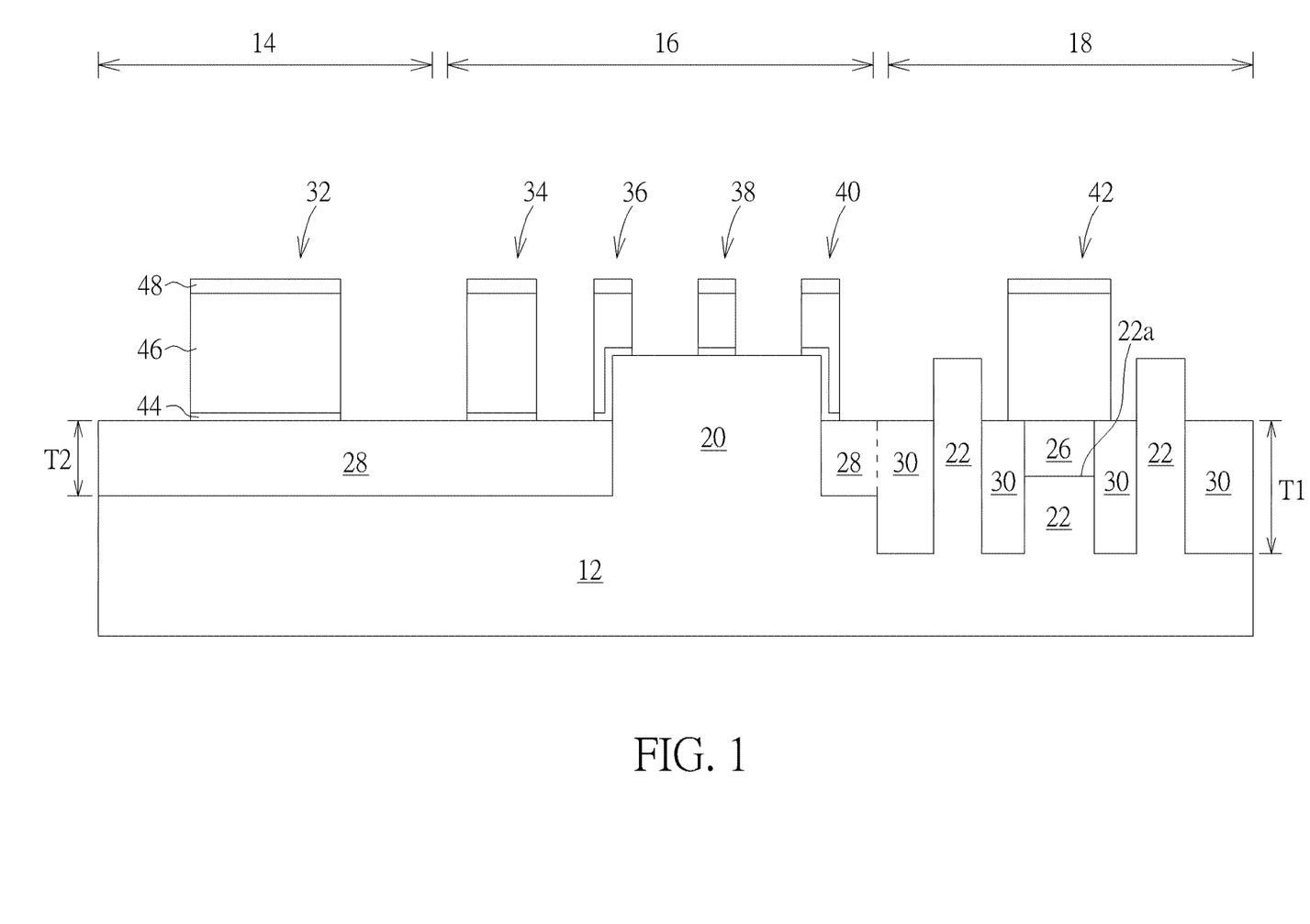
FIG. 1 is a schematic cross-sectional view of a semiconductor device after forming a shallow trench isolation.

Firstly, please refer to FIG. 1, a substrate 12 is provided, which includes for example a silicon substrate, an epitaxial silicon substrate, a silicon-containing substrate, or a silicon-on-insulator (SOI) substrate, and three or more than three regions are defined on the substrate 12, for example including a first region 14, a second region 16, and a third region 18. The first region 14 may be used as a capacitor region of the substrate 12 for forming a capacitor, the second region 16 may be used as a low-voltage region (LV region) of the substrate 12 for forming low-voltage components such as semiconductor transistors suitable for low-voltage operation, and the third region 18 may be used as a high-voltage region (HV region) of the substrate 12 for forming high-voltage components such as semiconductor transistors suitable for high-voltage operation. The first region 14, the second region 16, and the third region 18 may further include transistor regions with the same or different conductivity types, such as P-type semiconductor transistor regions and/or N-type semiconductor transistor regions, for forming gate structures with different threshold voltage in subsequent processes. In the present embodiment, the second region 16 is for example disposed between the first region 14 and the third region 18, but is not limited thereto, and those regions may further include other arrangements. Furthermore, the first region 14 and the second region 16, or, the second region 16 and the third region 18, may be directly adjacent to each other. Otherwise, another region such as a medium-voltage region (MV region) may be further disposed between the first region 14 and the second region 16, or, the second region 16 and the third region 18, but not limited thereto.

Next, a plurality of fin-shaped structures 20 is formed on the substrate 12 within the second region 16, and a plurality of bases 22 are formed on the substrate 12 within the third region 18 at the same time, as shown in FIG. 1. In one embodiment of the present disclosure, the fin-shaped structures 20 within the second region 16 and the bases 22 within the third region 18 may be formed for example through a sidewall aligned double patterning (SADP) process, which includes but is not limited to the following steps. Firstly, a mask layer (not shown in the drawings) is formed on the substrate 12, and the mask layer includes a plurality of mask patterns (not shown in the drawings) with the same pitch and the same width, or a plurality of mandrels (not shown in the drawings), a depositing and an etching processes are performed sequentially to form a spacer (not shown in the drawings) on sidewalls of each of the mask patterns or mandrels, the mask patterns or the mandrels are removed, and another etching process is performed under the coverage of the spacers, thereby transferring the patterns of the spacers into the substrate 12 underneath, and then, a fin cut process is performed to obtain the requested fin-shaped structures 20. Also, the bases 22 within the third region 18 may be simultaneously formed with the formation of the fin-shaped structures 20, either through the mandrels and the spacers, or through an additional mask pattern. Alternatively, in another embodiment, the formation of the fin-shaped structures 20 may also be accomplished by first forming a patterned mask (not shown in the drawings) on the substrate 12, and then, and performing an etching process through the patterned mask, to transfer the pattern of the patterned mask into the substrate 12 underneath to form the fin-shaped structure, or by first forming a patterned hard mask (not shown in the drawings) on the substrate 12, and performing a selective epitaxial growth (SEG) process on the substrate 12 through the patterned hard mask to form a semiconductor layer (not shown in the drawings, for example including silicon germanium), to serve as the corresponding fin-shaped structures 20, or bases 22.

Then, a flowable chemical vapor deposition (FCVD) process is performed on the substrate 12, to form an insulating material (not shown in the drawings) filled in the recesses between the fin-shaped structures 20 and the bases 22, and the insulating material is partially removed next through a planarization process such as chemical mechanical polishing (CMP) process, to from an insulating layer (not shown in the drawing) being coplanar with top surfaces of the fin-shaped structures 20 and the bases 22, and an etching back process is further performed on the substrate 12 to partially remove the insulating layer covered on the first region 14, the second region 16, and the third region 18, to form shallow trench isolations 28, 30 in the substrate 12, with the shallow trench isolations 28, 30 having flushed top surfaces being lower than the top surfaces of the fin-shaped structure 20 and the bases 22. In the present embodiment, the recesses disposed around the bases 22 include a related greater depth, and the shallow trench isolation 30 disposed within the third region 18 includes a relative greater depth T1 thereby. On the other hand, the shallow trench isolation 28 disposed within the first region 14 and the second region 16 may therefore include a related smaller depth T2, but is not limited thereto. Furthermore, another mask layer (not shown in the drawings) is formed on the substrate 12, and a thermal oxidation process such as a rapid thermal oxidation (RTO) process is performed through the another mask layer, after removing a portion of the bases 22, to form a gate dielectric layer 26 within the third region 18. After that, the another mask layer is completely removed. In the present embodiment, the gate dielectric layer 26 is formed on a plane 22a of the portion of the bases 22, and the plane 22a is lower than the top surfaces of the shallow trench isolations 28, 30, and also, is lower than the top surfaces of the fin-shaped structure 20 within the second region 16.

Following these, a plurality of gate structures 32, 34, 36, 38, 40, 42 is respectively formed on top surfaces of the shallow trench isolation 28, the fin-shaped structures 20, and the portion of the bases 22 within the first region 14, the second region 16 and the third region 18, wherein the gate structure 42 is directly disposed on the gate dielectric layer 26. The formation of the gate structures 32, 34, 36, 38, 40, 42 may be carried out by optionally performing a gate first and a high dielectric constant (high-k) first process, a gate last and a high-k first process, or a gate last and a high-k last process, based on practical product requirements, but not limited thereto. In the present embodiment, the gate structures 32, 34, 36, 38, 40, 42 are formed through the gate last and the high-k last process, which includes but is not limited to the following steps. Firstly, a gate dielectric material layer (not shown in the drawings, for example including a material like silicon oxide), a gate electrode material layer (not shown in the drawings, for example including a material like polysilicon), and a mask material layer (not shown in the drawings, for example including a material like silicon nitride or silicon carbonitride) are sequentially formed on the shallow trench isolation 28, the fin-shaped structures 20, and the bases 22, and a photolithography and an etching process is performed to partially remove the mask material layer, the gate electrode material layer, and the gate dielectric material layer. Accordingly, each of the gate structures 32, 34, 36, 38, 40, 42 formed thereby may include a gate dielectric layer 44, a gate electrode layer 46, and a mask layer 48 stacked form bottom to top, as shown in FIG. 1.

Figure 2:
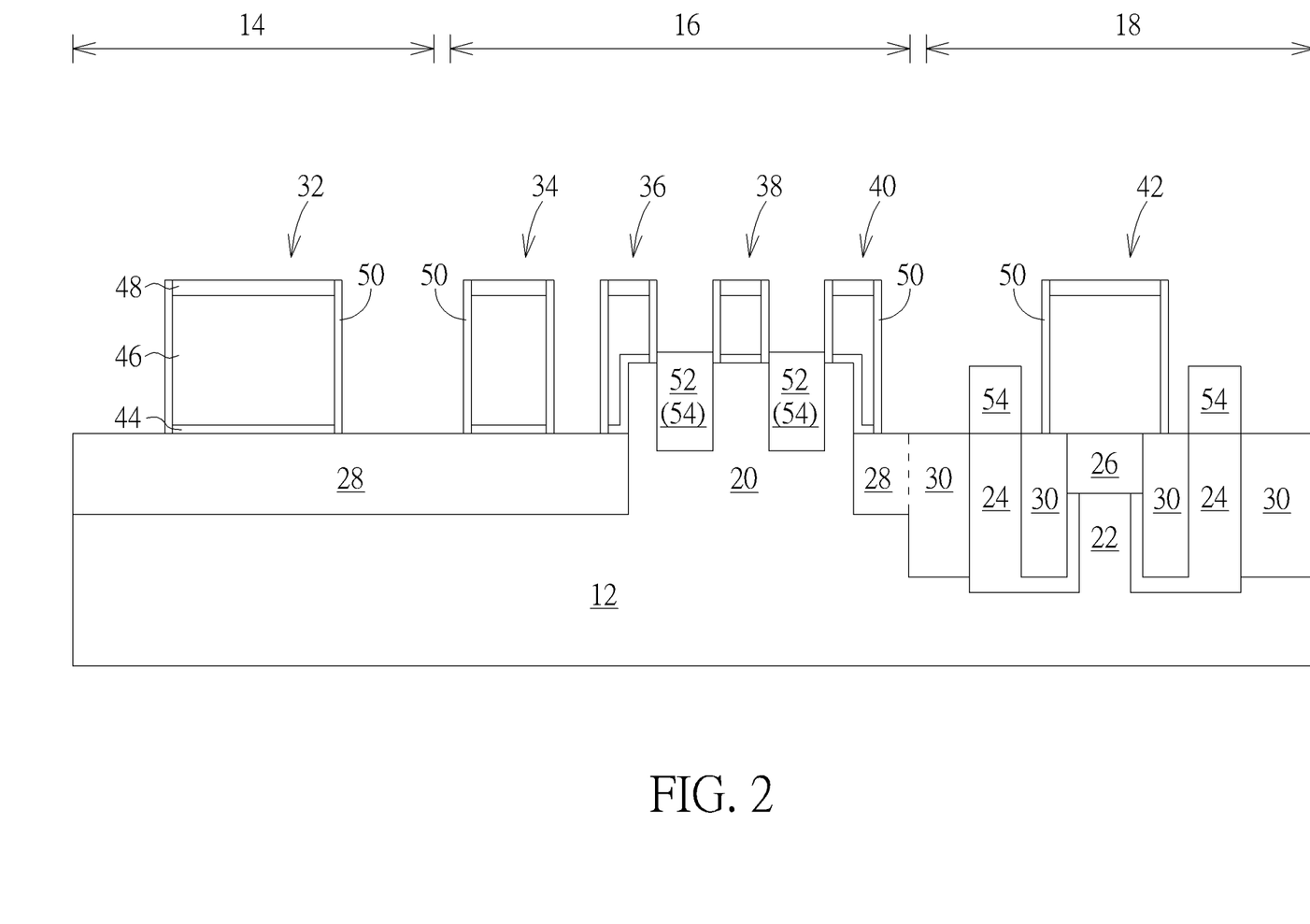
FIG. 2 is a schematic cross-sectional view of a semiconductor device after forming gate structures.

As shown in FIG. 2, an ion implantation process is performed in the third region 18, to form doped regions 24 in the base 22 at two sides of the gate dielectric layer 26. Then, the doped regions 24 may function like a light doped drain region of the high-voltage component in the subsequent process. Following these, a deposition process and an etching back process are sequentially performed on the substrate 12, to form spacers 50 on sidewalls of each of the gate structures 32, 34, 36, 38, 40, 42. In one embodiment, each of the spacers 50 may include a monolayer structure as shown in FIG. 2, or include a multilayer structure for example including a first spacer (not shown in the drawings), and a second spacer (not shown in the drawings) having different materials and stacked sequentially on the gate structures 32, 34, 36, 38, 40, 42, wherein the material of the spacers 50 may be selected from a group including silicon oxide ($SiO_x$), silicon nitride (SiN), silicon oxynitride (SiON), and silicon carbonitride (SiCN), but is not limited thereto.

After that, an etching process such as a dry etching process, a wet etching process or in sequent performed a dry etching process and a wet etching process, is performed along the spacers 50 within the second region 16, to etch the fin-shaped structures 20 downwardly either single time or multi-times, to partially remove the fin-shaped structure 20 at two sides of the gate structure 38, and then, a selectively epitaxial growing (SEG) process is performed to form epitaxial layers 52 in the fin-shaped structures 20, at two sides of the gate structure 38. It is noted that, the epitaxial layers 52 are only formed at two sides of the gate structure 38 within the second region 16, and there is no epitaxial layer formed within the first region 14 or the third region 18. It is also noted that, the epitaxial layer 52 may include any suitable material such as silicon germanium (SiGe), silicon-germanium-boron (SiGeB) silicon-germanium-tin (SiGeSn), silicon carbide (SiC), silicon-carbide-phosphorus (SiCP) or silicon phosphate (SiP), according to the type of a metal-oxide semiconductor (MOS) transistor formed subsequently. For example, when the epitaxial layer 52 includes SiGe, SiGeB, or SiGeSn, the MOS transistor is a P-type MOS transistor (PMOS), and when the epitaxial layer 52 includes SiC, SiCP, or SiP, the MOS transistor is an N-type MOS transistor (NMOS). Furthermore, the epitaxial layer 52 may be formed by a SEG process through a single or a multiple layer approach, and the heterogeneous atoms (such as germanium or carbon atoms) may also be altered in a gradual arrangement, preferably with the surface of the epitaxial layer 52 having a relative lighter concentration or no heterogeneous atoms (such as germanium atoms) at all, to facilitate the subsequent formation of a silicide layer.

Next, at least one ion implantation process is further performed to form source/drain regions 54 in the third region 18, and to form source/drain regions 54 in the epitaxial layers 52 in the second region 16, respectively. In one embodiment, the formation of the source/drain regions 54 may also be in-situ formed while the SEG process. For example, when the MOS transistor is a PMOS, the SiGe, SiGeB or SiGeSn epitaxial layer 52 may be doped in-situ with P type dopants thereby; or when the MOS transistor is a NMOS, the SiC, SiCP or SiP epitaxial layer 52 may be doped in-situ with N type dopants thereby. Thus, the following ion implantation process for forming the source/drain regions may be omitted. Also, in another embodiment, the dopant of source/drain regions 54 may either be altered in a gradual arrangement, but not limited thereto.

Figure 3:
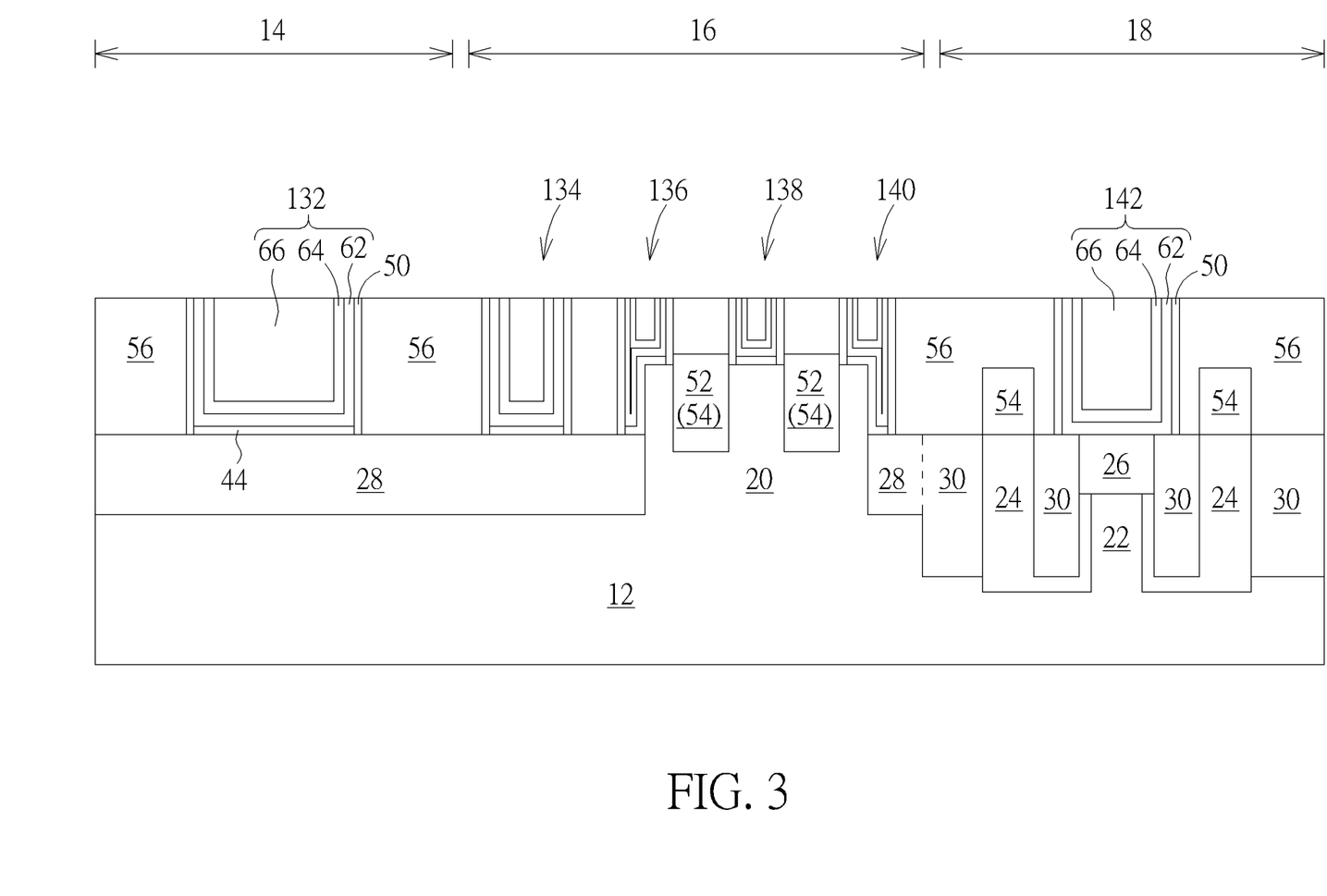
FIG. 3 is a schematic cross-sectional view of a semiconductor device after forming metal gates.

As shown in FIG. 3, a replacement metal gate (RMG) process is performed to replace at least a portion of the gate structures, for example the gate structures 32, 34, 36, 38, 40, 42 within the first region 14, the second region 16, and the third region 18 with metal gates 132, 134, 136, 138, 140, 145, and which include but is not limited to the following steps. Firstly, a contact etch stop layer (CESL, not shown in the drawings, for example including SiN), and an interlayer dielectric (ILD) layer (for example including $SiO_x$ or SiON) are sequentially formed on the substrate 12, to entirely cover each of the gate structures 32, 34, 36, 38, 40, 42, and then, a planarization process such as a chemical mechanical polish (CMP) process is performed, to partially remove the interlayer dielectric layer 56 and the contact etch stop layer, and to expose the mask layers 48 of each of the gate structures 32, 34, 36, 38, 40, 42. Next, an etching process such as a dry etching process, a wet etching process or in sequent performed a dry etching process and a wet etching process, is performed, to completely remove the mask layers 48 of each of the gate structures 32, 34, 36, 38, 40, 42, as well as the gate electrode layers 46 underneath, and to form a plurality of gate trenches (not shown in the drawings). In one embodiment, the etching process is performed for example by using an etching solution such as ammonium hydroxide ($NH_4OH$), or tetramethylammonium hydroxide (TMAH) to remove the mask layer 48 and the gate electrode layer 46, but not limited thereto.

Then, a high-k dielectric material layer (not shown in the drawings, for example including a dielectric material having a dielectric constant being higher than 4), a work function metal material layer (not shown in the drawings), and a metal material layer (not shown in the drawings, for example including a low-resistant metal material) are sequentially formed on the substrate 12 to fill up the gate trenches and to further cover on the top surface of the interlayer dielectric layer 56, and a planarization process is performed to partially remove the metal material layer, the work function metal material layer, and the high-k dielectric material layer, to form an U-shaped high-k dielectric layer 62, an U-shaped word function metal layer 64, and a gate electrode 66 stacked from bottom to top on the gate dielectric layer 44 within each of the gate trenches. Accordingly, the gate dielectric layer 44, the U-shaped high-k dielectric layer 62, the U-shaped word function metal layer 64, and the gate electrode 66 stacked from bottom to top within each gate trenches may together form metal gates 132, 134, 136, 138, 140, 142, wherein the top surfaces the gate electrodes 66 of each of the metal gates 132, 134, 136, 138, 140, 142 may be coplanar with each other, and also be coplanar with the top surface of the interlayer dielectric layer 56. In one embodiment, the high-k dielectric layer 62 for example includes a material selected from a group consisting of hafnium oxide ($HfO_2$), hafnium silicon oxide ($HfSiO_4$), hafnium silicate oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium oxide ($ZrSiO_4$), hafnium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST), and a combination thereof.

The work function metal layer 64 is configured to adjust the work function of the metal gates 132, 134, 136, 138, 140, 142, for better applying to the NMOS transistor or the PMOS transistor. For example, when the MOS transistor is NMOS transistor, the work function metal layer 64 may include metal materials having a work function being between 3.9 eV and 4.3 eV, such as TiAl, ZrAl, WAl, TaAl, HfAl or TiAlC, but not limited thereto; or when the MOS transistor is the PMOS transistor, the work function metal layer 64 may include metal materials having a work function being between 4.8 eV and 5.2 eV, such as TiN, TaN, or TaC, but not limited thereto. In one embodiment, a barrier layer (not shown in the drawings) may be further formed between the high-k dielectric layer 62 and the work function metal layer 64 and/or between the work function metal layer 64 and the gate electrode 66, and the barrier layer for example includes Ti, TiN, Ta, TaN, or the like.

Figure 4:
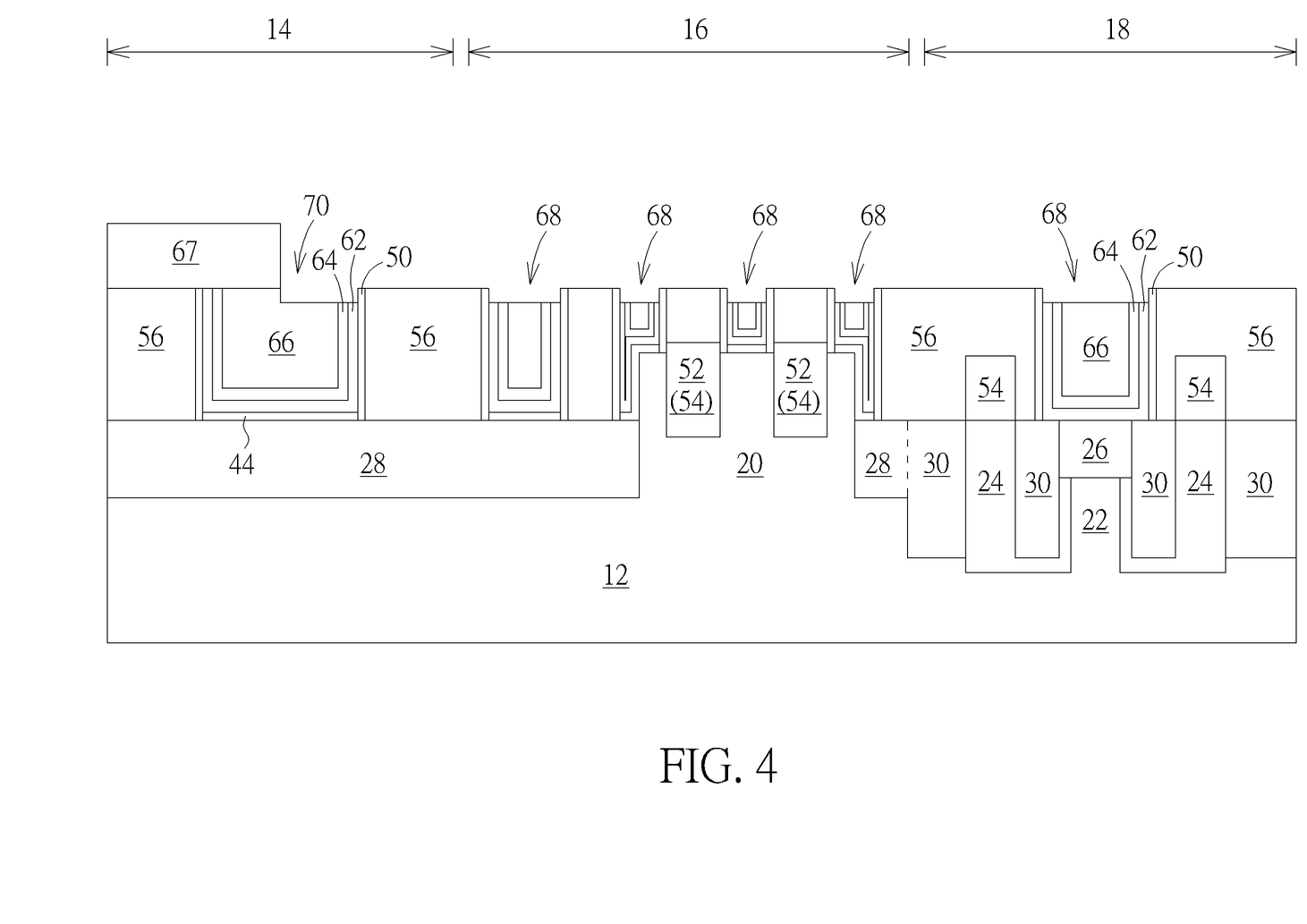
FIG. 4 is a schematic cross-sectional view of a semiconductor device after forming a recess.

As shown in FIG. 4, a mask layer 67 (for example including SiN) is formed within the first region 14, and an etching process such as a dry etching process, a wet etching process or in sequent performed a dry etching process and a wet etching process, is performed through the mask layer 67, to partially remove the gate electrode 66, the work function metal layer 64, and high-k dielectric layer 62 of each of the metal gates 132, 134, 136, 138, 140, 142. It is noted that, the top portions of the metal gates 134, 136, 138, 140, 142 within the second region 16 and the third region 18 are entirely removed, to form a plurality of recesses 68, so that, the rest portions of each of the metal gates 134, 136, 138, 140, 142 may therefor obtain a coplanar top surface being flushed with each other, with each of the recesses 68 being disposed thereabove. On the other hand, the top portion of the metal gate 132 within the first region 14 is partially removed because of being partially covered by the mask layer 67, so as to form a recess 70 only disposed at one side of the metal gate 132. Then, the metal gate 132 may therefore obtain a stepped top, as shown in FIG. 4.

Figure 5:
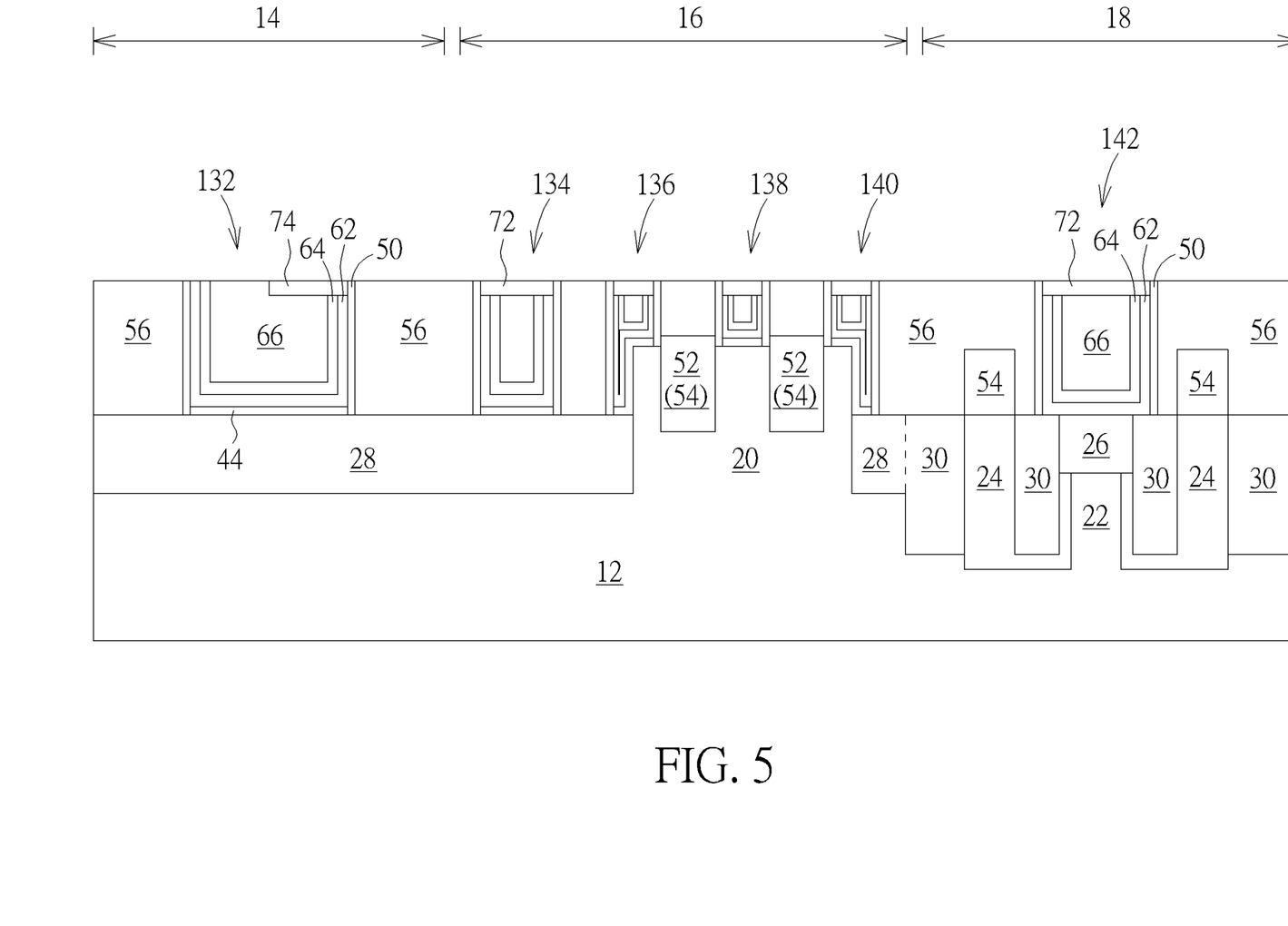
FIG. 5 is a schematic cross-sectional view of a semiconductor device after forming a capping layer.

After removing the mask layer 67, as shown in FIG. 5, capping layers 72, 74 are respectively formed in each recess 68, 70, wherein top surfaces of the capping layers 72, 74 are all coplanar with the top surface of the interlayer dielectric layer 56. It is noted that, the capping layers 72 within the second region 16 and the third region 18 may completely cover the gate electrodes 66 of the metal gates 134, 136, 138, 140, 142, with top surfaces thereof being flushed with each other, and the capping layer 174 within the first region 14 may partially cover the gate electrode 66 of the metal gate 132, with the top surface of the capping layer 174 being coplanar with the top surface of the gate electrode 66, as well as the top surface of the interlayer dielectric layer 56. Preferably, each of the capping layers 72, 74 has a certain thickness, so as to effectively protect the metal gates 132, 134, 136, 138, 140, 142 disposed underneath. For example, a thickness of each of the capping layers 72, 74 may be about 200 angstroms, but is not limited thereto. Also, in one embodiment, the capping layers 72, 74 for example include an insulating material like $SiO_x$, SiN, SiON, or SiCN, preferably include SiN, but is not limited thereto.

Figure 6:
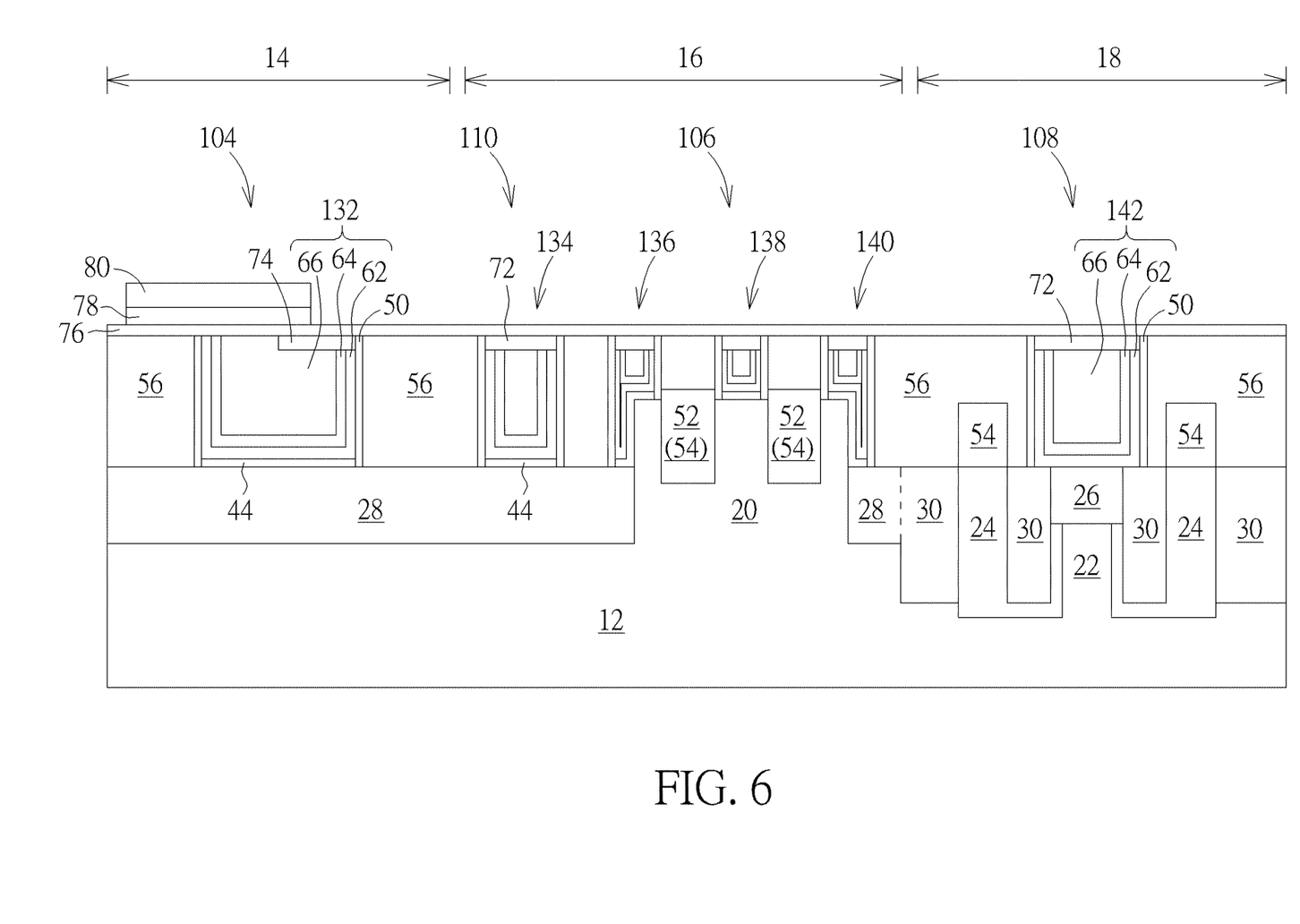
FIG. 6 is a schematic cross-sectional view of a semiconductor device after forming a capacitor and a semiconductor transistor.

As shown in FIG. 6, a dielectric layer 76, a conductive material layer (not shown in the drawings), and a protection material layer (not shown in the drawings) are sequentially formed on the substrate 12, to entirely cover on the metal gates 132, 134, 136, 138, 140, 142 and the interlayer dielectric layer 56 within the first region 14, the second region 16, and the third region 18, and a photolithography process and an etching process are performed to partially remove the protection material layer and the conductive material layer, thereby forming a conductive layer 78 and a protection layer 80 stacked on one another within the first region 14, wherein sidewalls of the conductive layer 78 and the protection layer 80 are vertically aligned with each other, and the dielectric layer 76 still cover on the top surfaces of the metal gates 132, 134, 136, 138, 140, 142 and the interlayer dielectric layer 56. It is noted that, the conductive layer 78 and the protection layer 80 are preferably overlapped with the capping layer 74 disposed underneath in a projection direction being perpendicular to the substrate 12 (such as the y-direction), and the conductive layer 78 and the gate electrode 66 disposed underneath preferably are misaligned with each other, so as to save a proper space for a plug which is electrically connected to the gate electrode 66 in a subsequent process, as shown in FIG. 6, but not limited thereto. Furthermore, in one embodiment, the dielectric layer 76 for example include a low dielectric constant (low-k) material like $SiO_x$, or tetraethoxysilane (TEOS), or a high-k dielectric material which is selected from a group consisting of $HfO_2$, $HfSiO_4$, HfSiON, $Al_2O_3$, $La_2O_3$, $Ta_2O_5$, $Y_2O_3$, $ZrO_2$, $SrTiO_3$, $ZrSiO_4$, $HfZrO_4$, $SrBi_2Ta_2O_9$, SBT, $PbZr_xTi_{1-x}O_3$, $Ba_xSr_{1-x}TiO_3$, and a combination thereof. In another embodiment, the conductive layer 78 for example includes metallic nitride such as TiN, and the protection layer 80 includes an insulating material such as $SiO_x$, SiN, SiON, or SiCN, preferably includes SiN, but not limited thereto.

Through these performances, a metal-insulator-metal (MIM) capacitor 104 is formed in the first region 14, a semiconductor transistor 106 suitable for low-voltage operation is formed in the second region 16, and a semiconductor transistor 108 suitable for high-voltage operation is formed in the third region 18 at the same time. The capacitor 104 within the first region 14 is directly disposed on the shallow trench isolation 28, and which includes the metal gate 132, the dielectric layer 76, the conductive layer 78, and the protection layer 80 stacked from bottom to top, wherein the gate dielectric layer 44 is further disposed between the metal gate 132 and the shallow trench isolation 28. It is noted that, the metal gate 132 and the conductive layer 78 respectively serve as a top electrode layer and a bottom electrode layer of the capacitor 104, and the dielectric layer 76 serves as a capacitor dielectric layer of the capacitor, and also serves as a capping layer for covering the second region 16 and the third region 18. On the other hand, the semiconductor transistors 106, 108 formed within the second region 16 and the third region 18 respectively include the gate dielectric layer 44/26, the U-shaped high-k dielectric layer 62, the U-shaped work function metal layer 64, the metal layer 66 and the capping layer 72, wherein the gate dielectric layer 44 of the semiconductor transistor 106 within the second region 16 is disposed on the fin-shaped structures 20, and the semiconductor transistor 108 within the third region 18 is disposed on the gate dielectric layer 26 which is disposed on the plane 22a of the base 22 and has a relative greater thickness.

Accordingly, the formation of the bottom electrode layer of the capacitor 104 may be integrated into the general gate process of the semiconductor transistors 106, 108, and the capacitor 104 and the semiconductor transistors 106, 108 are allowable to be formed simultaneously in different regions of the semiconductor device, under a simplified process flow, with each of the capacitor 104 and the semiconductor transistors 106, 108 having an integrated structure and being capable of providing better function and performance. Additionally, another semiconductor transistor 110 may be further formed at the boundary between the first region 14 and the second region 16, and which is also disposed on the shallow trench isolation 28, between the capacitor 104 and the semiconductor transistor 106. The semiconductor transistor 110 also includes the gate dielectric layer 44, the U-shaped high-k dielectric layer 62, the U-shaped work function metal layer 64, the metal layer 66, and the capping layer 72, so that, the semiconductor transistor 110 may further serve as a wire or a gate line, for picking up the substrate 12, but not limited thereto.

Figure 7:
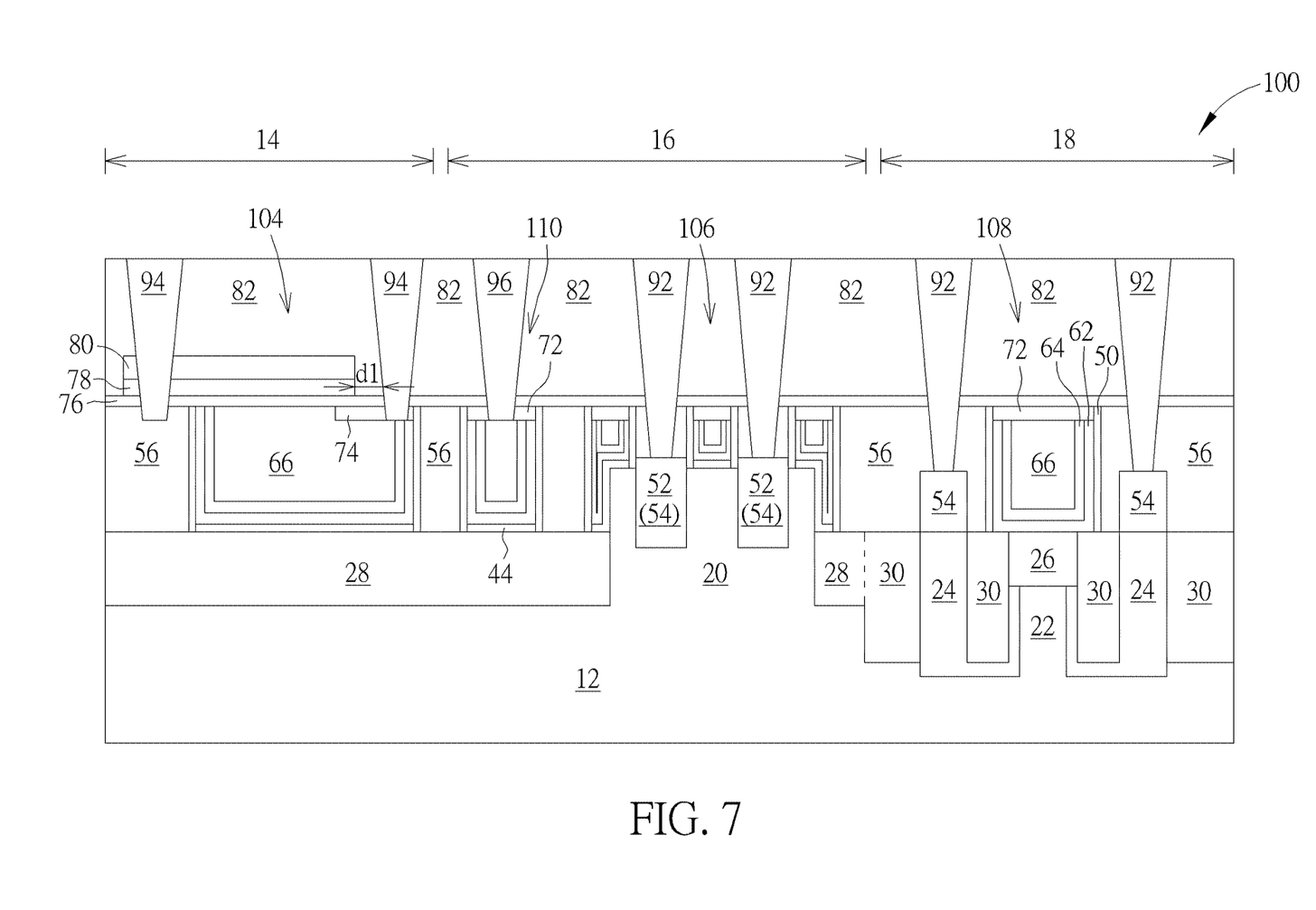
FIG. 7 is a schematic cross-sectional view of a semiconductor device after forming a plug.

Next, as shown in FIG. 7, a plurality of plugs 92, 94 is further formed for electrically connecting the capacitor 104 and the semiconductor transistors 106, 108, due to the practical product requirements, and the formation of the plugs 92, 94 for example includes but not limited to the following steps. Firstly, another interlayer dielectric layer 82 is formed on the interlayer dielectric layer 56, and a patterning process is performed, to partially remove the interlayer dielectric layers 56, 82 at two sides of each of the metal gates 138, 140 through a mask layer (not shown in the drawings), thereby forming a plurality of contact holes (not shown in the drawings) to expose the source/drain regions 54 with in the second region 16 and the third region 18. Meanwhile, the interlayer dielectric layers 56, 82 disposed at one side and the top of the metal gate 132 is also partially removed, to form a plurality contact holes (not shown in the drawings) to partially expose the top of the metal gate 132 and the interlayer dielectric layer 56 at the one side of the metal gate 132. Then, a required conductive material is filled in the contact holes, wherein the required material for example includes a barrier material layer such as including Ti, TiN, Ta, TaN, and a metal material layer such as including a low-resistant metal like W, Cu, Al, TiAl, or cobalt tungsten phosphide (CoWP), and a planarization process such a chemical mechanical polishing process is performed to partially remove the metal material layer and the barrier material layer, to form the plugs 92, 94 in the contact holes.

It is noteworthy that, the plugs 92 formed in the second region 16 and the third region 18 are sequentially penetrated through the interlayer dielectric layer 82, the dialectic layer 76, and the interlayer dielectric layer 56, to directly contact the source/drain regions 54 of the semiconductor transistors 106, 108. Then, the plugs 92 are allowable to be electrically connected to the semiconductor transistors 106, 108 within the second region 16 and the third region 18, wherein the bottom surface of the plugs 92 which is electrically connected to the source/drain regions 54 of the semiconductor transistor 108 is slightly lower than the bottom surface of the plugs 92 which is electrically connected to the source/drain regions 54 of the semiconductor transistor 106, as shown in FIG. 7, but not limited thereto.

On the other hand, one of the two plugs 94 formed in the first region 14 is sequentially penetrated through the interlayer dielectric layer 82, the protection layer 80, the conductive layer 78, the dielectric layer 76, and the interlayer dielectric layer 56, to as to be in annular contact with the conductive layer 78, and another one of the two plugs 94 formed in the first region 14 is penetrated through the interlayer dielectric 82, the dielectric layer 76, and the capping layer 74 only, to directly contact the metal gate 132 underneath. Accordingly, the two plugs 94 are namely electrically connected to the top electrode layer (namely, the conductive layer 78) and the bottom electrode layer (namely, the metal gate 132) of the capacitor 104 within the first region 14. However, although the two plugs 94 are respectively penetrated through the stacked layers of different materials and numbers, and contact with different film layers, two plugs 94 still have bottom surfaces that are flush with each other, as shown in FIG. 7. It is also noted that, the plug 94 which is electrically connected to the bottom electrode layer (namely, the metal gate 132) of the capacitor 104 is preferably separate apart from the sidewalls of the conductive layer 78 and the protection layer 82 by a certain distance "d1", so that, the plug 94 which is electrically connected to the bottom electrode layer of the capacitor 104 may not directly in contact with the conductive layer 78 disposed on the metal gate 132.

Moreover, plugs 96 may also be formed while forming the plugs 92, 94, to electrically connect to the semiconductor transistor 110 at the boundary between the first region 14 and the second region 16, wherein the plugs 96 are sequentially penetrated through the interlayer dielectric layer 82, the dielectric layer 76, and the capping layer 72, to directly contact the top surface of the gate electrode 66, thereby being electrically connected to the semiconductor transistor 110, as shown in FIG. 7. In one embodiment, the bottom surfaces of the plugs 96 may be coplanar with the bottom surfaces of the plugs 94 within the first region 14, but not limited thereto.

Thus, the fabrication of the semiconductor device 100 according to one embodiment of the present disclosure has been accomplished. According to the fabricating method of the present embodiment, the formation of the bottom electrode layer of the capacitor 104 is integrated into the general gate process of the semiconductor transistors 106, 106, and the capacitor 104 and the semiconductor transistors 106, 108 are allowable to be formed simultaneously in different regions of the semiconductor device 100, under a simplified process flow, with each of the capacitor 104 and the semiconductor transistors 106, 108 having an integrated structure and being capable of providing better function and performance. Also, the plugs 92, 94 which are electrically connected to the top electrode layer, and the bottom electrode layer of the capacitor 104, and the semiconductor transistors 106, 108 may be simultaneously formed in the subsequent fabricating process of the interconnection elements. In other word, the present disclosure may effectively integrate the formations the capacitor 104 and the semiconductor transistors 106, 106 which are far different in structure, while both maintaining the structural integrity of the capacitor 104 and the semiconductor transistors 106, 108, so as to be beneficial on improving the overall performance of the semiconductor device 100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a substrate having a high-voltage region and a capacitor region;
   a first transistor disposed in the high-voltage region, the first transistor comprising:
      a first gate dielectric layer disposed on a plane of the substrate;

a first gate electrode disposed on the first gate dielectric layer; and
a first capping layer disposed on the first gate electrode;
a capacitor disposed in the capacitor region, the capacitor comprising:
a second gate electrode disposed on the substrate;
a second capping layer disposed on the second gate electrode;
a dielectric layer disposed on the second capping layer and the first capping layer, wherein the dielectric layer completely covers the first gate electrode and the second gate electrode, and the dielectric layer comprises tetraethoxysilane or a high dielectric constant dielectric material; and
a conductive layer disposed on the dielectric layer; and
two first plugs, disposed on the capacitor, wherein one of the two first plugs penetrates through the second capping layer to directly contact the second gate electrode, and another one of the two first plugs directly contacts the conductive layer.

2. The semiconductor device according to claim 1, wherein the second capping layer partially covers the second gate electrode and a top surface of the second capping layer is coplanar with a top surface of the second gate electrode.

3. The semiconductor device according to claim 1, wherein bottom surfaces of the two first plugs are flushed with each other.

4. The semiconductor device according to claim 1, wherein the conductive layer is partially overlapped with the second capping layer in a projection direction, and the conductive layer is spaced apart from the one of the two first plugs by a distance.

5. The semiconductor device according to claim 1, further comprising:
a first shallow trench isolation, disposed in the substrate; and
a second shallow trench isolation, disposed in the substrate, wherein the second gate electrode is disposed on the second shallow trench isolation, and a depth of the first shallow trench isolation is greater than a depth of the second shallow trench isolation.

6. The semiconductor device according to claim 5, further comprising:
a second gate dielectric layer, disposed between the second gate electrode and the second shallow trench isolation.

7. The semiconductor device according to claim 6, wherein the first gate electrode and the second gate electrode comprise coplanar top surfaces and a same material.

8. The semiconductor device according to claim 5, further comprising:
a third transistor disposed on the substrate, between the second transistor and the capacitor, and the third transistor comprising:
a fourth gate dielectric layer disposed on the substrate;
a fourth gate electrode disposed on the fourth gate dielectric layer; and
a fourth capping layer disposed on the fourth gate electrode.

9. The semiconductor device according to claim 8, further comprising:
a third plug disposed on the third transistor, wherein a bottom surface of the third plug is flushed with bottom surfaces of the two first plugs.

10. The semiconductor device according to claim 1, further comprising:

a second transistor, disposed in a low-voltage region of the substrate, the second transistor comprising:
a plurality of fin-shaped structures disposed in the substrate;
a third gate dielectric layer disposed on the fin-shaped structures;
a third gate electrode disposed on the third gate dielectric layer; and
a third capping layer disposed on the third gate electrode.

11. The semiconductor device according to claim 10, further comprising:
a plurality of second plugs, disposed on the first transistor and the second transistor respectively, wherein bottom surfaces of the second plugs disposed on the first transistor are lower than bottom surface of the second plugs disposed on the second transistor.

12. A method of fabricating a semiconductor device, comprising:
providing a substrate having a high-voltage region and a capacitor region;
forming a first transistor in the high-voltage region, the first transistor comprising:
a first gate dielectric layer disposed on a plane of the substrate;
a first gate electrode disposed on the first gate dielectric layer; and
a first capping layer disposed on the first gate electrode;
forming a capacitor in the capacitor region, the capacitor comprising:
a second gate electrode disposed on the substrate;
a second capping layer disposed on the second gate electrode;
a dielectric layer disposed on the second capping layer and the first capping layer, wherein the dielectric layer completely covers the first gate electrode and the second gate electrode, and the dielectric layer comprises tetraethoxysilane or a high dielectric constant dielectric material; and
a conductive layer disposed on the dielectric layer; and
forming two first plugs on the capacitor, wherein one of the two first plugs penetrates through the second capping layer to directly contact the second gate electrode, and another one of the two first plugs directly contacts the conductive layer.

13. The method of fabricating the semiconductor device according to claim 12, further comprising:
forming a first shallow trench isolation in the substrate; and
forming a second shallow trench isolation in the substrate, wherein the second gate electrode is formed on the second shallow trench isolation, and a depth of the first shallow trench isolation is greater than a depth of the second shallow trench isolation.

14. The method of fabricating the semiconductor device according to claim 13, further comprising:
forming a plurality of gate structures on the substrate; and
performing a replacement metal gate process, to form a plurality of metal gates.

15. The method of fabricating the semiconductor device according to claim 13, further comprising:
after forming the metal gates, forming a mask layer on the substrate, partially covering one of the metal gates formed within the capacitor region; and
performing an etching process through the mask layer, to form the first gate electrode and the second gate electrode.

16. The method of fabricating the semiconductor device according to claim 15, wherein the first capping layer and the second capping layer are formed after the etching process, the second capping layer partially covers the second gate electrode, and the first capping layer completely covers the first gate electrode.

17. The method of fabricating the semiconductor device according to claim 15, wherein after the etching process, further comprising:
 forming the dielectric layer, covering the first capping layer and the second capping layer;
 sequentially forming a conductive material layer and a protection material layer on the dielectric layer; and
 patterning the conductive material layer and the protection material layer, to form the conductive layer and a protection layer on the dielectric layer, wherein the conductive layer is partially overlapped with the second capping layer in a projection direction, and the conductive layer is spaced apart from the one of the two first plugs by a distance.

18. The method of fabricating the semiconductor device according to claim 12, further comprising:
 forming a second transistor in a low-voltage region of the substrate, the second transistor comprising:
  a plurality of fin-shaped structures disposed in the substrate;
  a third gate dielectric layer disposed on the fin-shaped structures;
  a third gate electrode disposed on the third gate dielectric layer; and
  a third capping layer disposed on the third gate electrode.

19. The method of fabricating the semiconductor device according to claim 18, further comprising:
 forming a third transistor on the substrate, between the second transistor and the capacitor, and the third transistor comprising:
  a fourth gate dielectric layer disposed on the substrate;
  a fourth gate electrode disposed on the fourth gate dielectric layer; and
  a fourth capping layer disposed on the fourth gate electrode.

\* \* \* \* \*